(12) United States Patent
Anwar

(10) Patent No.: US 11,996,841 B2
(45) Date of Patent: May 28, 2024

(54) COMPARATOR CIRCUIT AND DRIVER

(71) Applicant: JVCKENWOOD Corporation, Yokohama (JP)

(72) Inventor: Marta Dinata Anwar, Yokohama (JP)

(73) Assignee: JVCKENWOOD CORPORATION, Yokohama (JP)

( * ) Notice: Subject to any disclaimer, the term of this patent is extended or adjusted under 35 U.S.C. 154(b) by 113 days.

(21) Appl. No.: 17/955,190

(22) Filed: Sep. 28, 2022

(65) Prior Publication Data

US 2023/0015972 A1 Jan. 19, 2023

Related U.S. Application Data

(63) Continuation of application No. PCT/JP2022/006204, filed on Feb. 16, 2022.

(30) Foreign Application Priority Data

May 25, 2021 (JP) ................. 2021-087342

(51) Int. Cl.
*H03K 19/00* (2006.01)
*G09G 3/20* (2006.01)
*H03K 3/012* (2006.01)
*H03K 5/24* (2006.01)
*H03K 17/687* (2006.01)

(52) U.S. Cl.
CPC .......... *H03K 19/0013* (2013.01); *G09G 3/20* (2013.01); *H03K 3/012* (2013.01); *H03K 5/249* (2013.01); *H03K 17/687* (2013.01); *G09G 2310/0286* (2013.01); *G09G 2330/021* (2013.01)

(58) Field of Classification Search
CPC .... H03K 19/0013; H03K 3/012; H03K 5/249; H03K 17/687; G09G 3/20; G09G 2310/0286; G09G 2330/021
See application file for complete search history.

(56) References Cited

U.S. PATENT DOCUMENTS 7,919,991 B1 * 4/2011 Joshi ................. H03K 5/26
327/12
10,360,846 B2 * 7/2019 Cok ................. G09G 3/2014

FOREIGN PATENT DOCUMENTS

JP 2013105166 A 5/2013

* cited by examiner

*Primary Examiner* — Ryan Johnson
*Assistant Examiner* — Colleen J O Toole
(74) *Attorney, Agent, or Firm* — Procopio, Cory, Hargreaves & Savitch LLP

(57) ABSTRACT

A comparator circuit according to this embodiment includes: a comparator element configured to output a matching signal indicating whether or not a value of a first input signal matches a value of a second input signal; a flip-flop circuit configured to hold a data of a data input terminal based on a comparator clock signal and configured to output an enable signal for stopping an operation of the comparator element; and an internal signal generation circuit configured to output an internal signal to the data input terminal based on the matching signal and an output signal output from the flip-flop circuit.

5 Claims, 7 Drawing Sheets

COMPARATOR CIRCUIT AND DRIVER

CROSS REFERENCE TO RELATED APPLICATION

This application is based upon and claims the benefit of priority from Japanese patent application No. 2021-087342, filed on May 25, 2021, the disclosure of which is incorporated herein in its entirety by reference.

BACKGROUND

This disclosure relates to a comparator circuit and a driver.

In FIG. 2 of Patent Literature 1 (Japanese Unexamined Patent Application Publication No. 2013-105166), a comparator compares the counter output with pixel value of the digital image data. The comparator outputs a matching pulse indicating the both data are matched to the D-type flip-flop circuit. Then, the positive and negative polarity switches are switched in conjunction with the output of the D-type flip-flop.

SUMMARY

In Patent literature 1, the comparator performs a comparison operation to compare the counter output with the digital image data even after the counter output matches the digital image data. In other words, even after the comparator outputs the matching pulse, the switching operation continues. Therefore, there is a problem when the power consumption in the comparator becomes large.

A comparator circuit according to this embodiment including; a comparator element configured to output a matching signal indicating whether or not a value of a first input signal matches a value of a second input signal; a flip-flop circuit configured to hold a data of a data input terminal based on a comparator clock signal and configured to output an enable signal for stopping an operation of the comparator element; and an internal signal generation circuit configured to output an internal signal to the data input terminal based on the matching signal and an output signal output from the flip-flop circuit.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Hereafter, a specific embodiment to which the present invention is applied will be described in detail with reference to the drawings. However, this disclosure is not limited to the following examples. In addition, the following descriptions and drawings have been simplified, as appropriate, for clarity.

Figure 1:
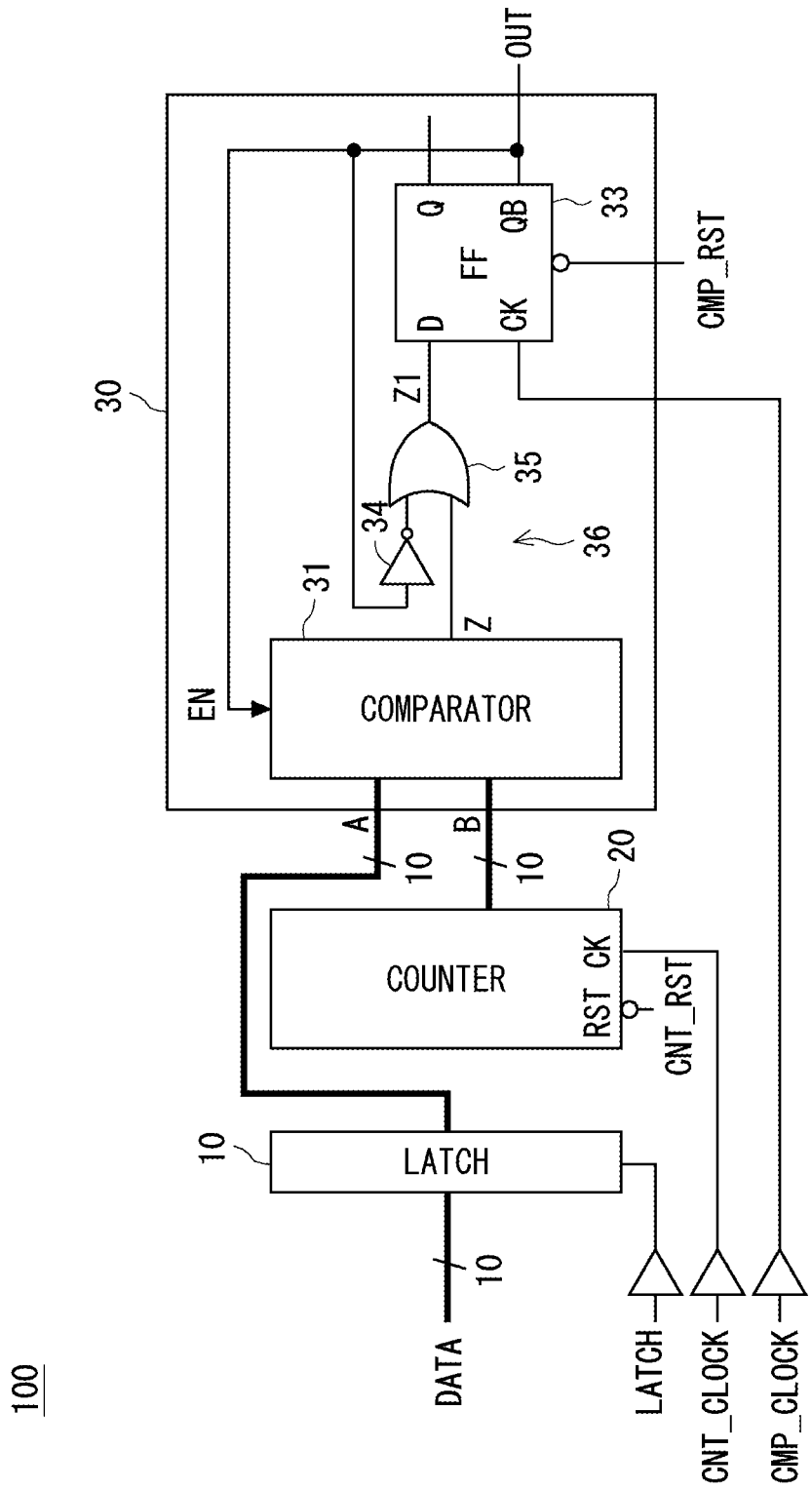
FIG. 1 is a circuit diagram showing the configuration of the driver using the comparator circuit.

The comparator circuit according to the present embodiment and the driver using it are described below. FIG. 1 is a circuit diagram showing a driver 100 with a comparator circuit 30. Specifically, the driver shown in FIG. 1 is a horizontal driver for driving one row of pixels in a liquid crystal display device.

The driver 100 includes a latch circuit 10, a counter 20 and the comparator circuit 30. Here, 10-bit image data DATA are input to the driver 100. That is, one pixel is represented in 1,024 greyscales (=10 bits). Of course, the number of bits of image data is not limited to the above values.

Figure 2:
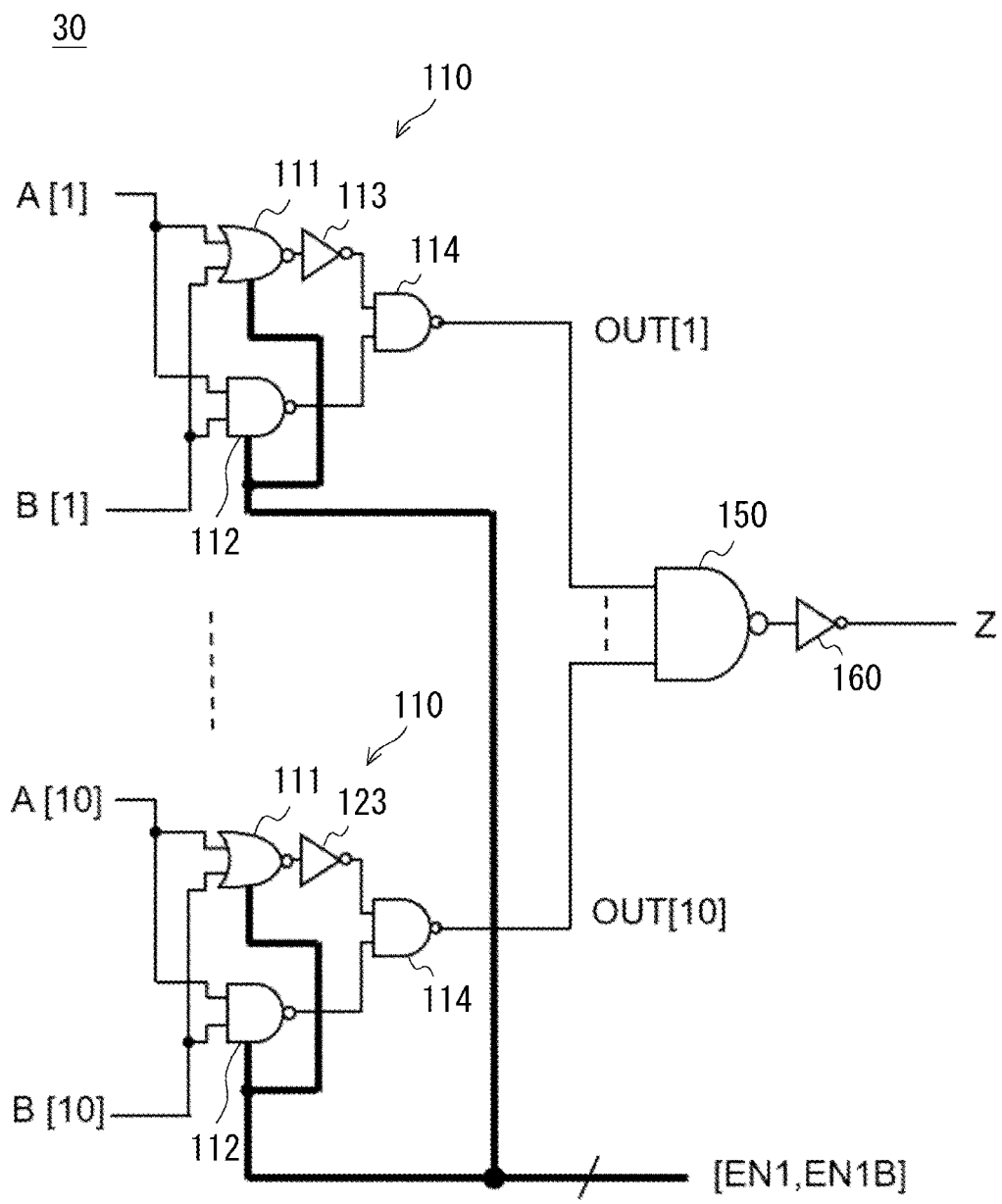
FIG. 2 is a circuit diagram showing the configuration of comparator element.

A latch signal LATCH and the image data DATA are input to the latch circuit 10. The latch circuit 10 latches the 10-bit image data DATA in response to the latch signal LATCH. The latch circuit 10 outputs the latched image data DATA to the comparator circuit 30 in parallel. The image data DATA output from the latch circuit 10 is defined as the latch output A. The latch output A is 10-bit parallel data. In FIG. 2, the value of the latch output A is defined as $\alpha$.

A counter clock signal CNT_CLOCK and a counter reset signal CNT_RST are input to the counter 20. The counter 20 performs a counting operation in synchronization with the counter clock signal CNT_CLOCK. For example, the counter 20 counts up the count value at the clock frequency of the counter clock signal CNT_CLOCK. The counter 20 outputs the count value generated by the counting operation to the comparator circuit 30.

The counter 20 resets the count value to the initial value in response to the counter reset signal CNT_RST. The counter reset signal CNT_RST corresponds to the horizontal scanning frequency. The output of counter 20 is 10-bits. Thus, the counter 20 increments the count value by one from 0 to 1023. The counter 20 outputs a 10-bit count value to the comparator circuit 30. The count value output from the counter 20 is defined as the counter output B. The counter output B is 10-bit parallel data.

The comparator circuit 30 includes a comparator element 31, a FF (flip-flop) circuit 33 and an internal signal generation circuit 36. The internal signal generation circuit 36 includes an inverter 34 and a OR circuit 35.

The comparator element 31 compares the latch output A with the counter output B. The comparator element 31 generates a matching signal Z indicating that the latch output A matches the counter output B. The comparator element 31 outputs the matching signal Z to the OR circuit 35. The latch output A and the counter output B are each 10-bits of parallel data, respectively. The comparator element 31 compares each bit of the latch output A with each corresponding bit of the counter output B. The comparator element 31 determines that the latch output A matches the counter output B when all the bits of the latch output A respectively coincide with those of the counter output B.

When the latch output A matches the counter output B, the comparator element 31 asserts the matching signal Z. When the latch output A does not match the counter output B, the comparator element 31 deasserts the matching signal Z, and therefore the matching signal Z becomes a positive pulse signal which becomes a high-level signal when the latch output A matches the counter output B.

The internal signal generation circuit 36 generates an internal signal Z1 based on the output signals OUT from the FF circuit 33 and the matching signal Z. The internal signal generation circuit 36 outputs the internal signal Z1 to the FF circuit 33.

The FF circuit 33 is a D-type flip-flop circuit. The FF circuit 33 has a data input terminal D, a clock input terminal CK, a non-inverted output terminal Q, and an inverted output terminal QB. The output of the internal signal generation circuit 36 is connected to a data input terminal D. The internal signal Z1 from the OR circuit 35 is input to the data input terminal D. A comparator clock signal CMP_CLOCK is input to the clock input terminal CK from an external circuit. The FF circuit 33 samples and holds the data value of the data input terminal D according to the comparator clock signal CMP_CLOCK. The FF circuit 33 holds a value of 1-bit.

The FF circuit 33 outputs a non-inverted output signal corresponding to the held value from the non-inverted output terminal Q. The FF circuit 33 outputs the inverted output signal obtained by inverting the non-inverted output signal from the inverted output terminal QB. The inverted output signal becomes the output signal OUT from the comparator circuit 30. When the value of the input data held by the FF circuit 33 is 1, the level of the non-inverted output signal becomes high while the level of the inverted output signal becomes low. When the value of the input data held by the FF circuit 33 is 0, the level of the non-inverted output signal becomes low while the level of the inverted output signal becomes high.

The output signal OUT of the FF circuit 33 is input to the FF circuit 33 via an inverter 34. The inverter 34 inverts the output signal OUT from the FF circuit 33 and outputs it to the OR circuit 35. The OR circuit 35 outputs a logical sum of the output from the inverter 34 and the matching signal Z as the internal signal Z1. The OR circuit 35 outputs the internal signal Z1 to the data input terminal D of FF circuit 33.

A comparator reset signal CMP_RST is input to the FF circuit 33. The FF circuit 33 resets the holding data in response to the comparator reset signal CMP_RST. As a result, the data value held in the FF circuit 33 becomes 0. When the FF circuit 33 is reset by the comparator reset signal CMP_RST, the level of the inverted output signal becomes high while the level of the non-inverted output signal becomes low.

After the FF circuit 33 is reset by the comparator reset signal CMP_RST, the FF circuit 33 samples the value of the internal signal Z1 in response to the internal signal Z1. Therefore, the output signal OUT output from the inverted output terminal QB becomes a negative step signal when the level of the internal signal Z1 is high Furthermore, the output signal OUT from the inverted output terminal of FF circuit 33 becomes an enable signal EN to control the comparator element 31. That is, the output signal OUT is input to the comparator element 31 as the enable signal EN. The comparator element 31 stops operating in response to the enable signal EN. Specifically, when the level of the enable signal is high, the comparator element 31 performs the comparison operation as a usual. When the level of the enable signal is low, the comparator element 31 stops the comparison operation. When the level of the enable signal EN is high, the comparator element 31 compares the latch output A with the counter output B. When the level of the enable signal EN is low, the level of the matching signal Z is fixed so as to be low without the comparator element 31 comparing the latch output A with the counter output B.

Thus, the comparator element 31 stops operating in response to the output signal OUT from the FF circuit 33. That is, the output signal OUT, which is a negative step signal, stops the comparator element 31. Specifically, after the comparator element 31 outputs a positive pulse signal as the matching signal Z, the comparator element 31 stops operating. This prevents switching operation from occurring in the comparator element 31, thus reducing a power consumption.

FIG. 2 is a circuit diagram showing an example of the configuration of the comparator element 31. As described above, the comparator element 31 compares 10 bits of data to each other. For the latch output A and the counter output B, the $1^{st}$ bit data is defined as the latch output A [1] and the counter output B [1], respectively, and the 10th bit data is defined as the latch output A [10] and the counter output B [10].

The comparator element 31 includes a plurality of one bit comparators 110, a NAND circuit 150, and an inverter 160. The comparator element 31 has 10 one bit comparators 110 for comparing 10 bits of data to each other. The number of one bit comparators 110 is equal to the number of bits of the latch output A, that is, the number corresponding to the number of gradation bits. The respective circuit configurations of the one bit comparators 110 are the same as each other. The 2nd to 9th one bit comparators 110 are omitted in FIG. 2. In the following description, we mainly describe the one bit comparator 110 that compares the latch output A [1] with the counter output B [1].

The one bit comparator 110 includes a NOR circuit 111, a NAND circuit 112, an inverter 113, and a NAND circuit 114. The first bit latch output A [1] and the first bit counter output B [1] are input to the NOR circuit 111. The NOR circuit 111 outputs the NOR (a negative logical sum) of the latch output A [1] and the counter output B [1] to the inverter 113. The inverter 113 inverts the output of the NOR circuit 111 and outputs it to the NAND circuit 114.

The first bit latch output A [1] and the counter output B [1] are input to the NAND circuit 112. The NAND circuit 112 outputs the NAND (a negative logical product) of the latch output A [1] and the counter output B [1] to the NAND circuit 114. The output of the NAND circuit 112 and the output of the inverter 113 are input to the NAND circuit 114. The NAND circuit 114 outputs the NAND (a negative logical sum) of the output of the NAND circuit 112 and the output of the inverter 113 to the NAND circuit 150 as an output signal OUT [1]. When the value of the latch output A [1] matches the value of the counter output B [1], the level of the output of the NAND circuit 150 becomes high.

As described above, the comparator element 31 includes the 10 one bit comparators 110. The outputs of the 10 one bit comparators 110 are input to the NAND circuit 150. For example, the 10th one bit comparator 110 outputs the negative logical product of the NAND circuit 114 to the NAND circuit 150 as an output signal OUT [10].

The NAND circuit 150 outputs the negative logical product of 10 bits of output signals OUT [1] to OUT [10] to the inverter 160. The inverter 160 inverts the output of NAND circuit 150. The signal output from the inverter 160 becomes the matching signal Z. When the levels of the output signal OUT [1] to the output signal OUT [10] are high, the level of the matching signal Z becomes high. The matching signal Z is asserted when the bit values of latch outputs A [1] to A [10] respectively match bit values of the counter outputs B [1] to B [10]. The matching signal Z is deasserted when at least one bit value of latch outputs A [1] to A [10] is different from a value of the corresponding bit of the counter outputs B [1] to B [10].

Figure 3:
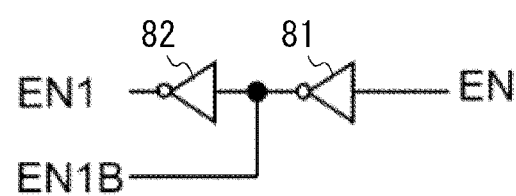
FIG. 3 is a circuit diagram showing the polarity of the enable signals EN1 and EN1B.

Furthermore, enable signals EN1 and EN1B are input to the NOR circuit 111 and the NAND circuit 112. The enable signal EN1 and the enable signal EN1B are generated based on the enable signal EN shown in FIG. 1. More specifically, as shown in FIG. 3, an inverter 81 and an inverter 82 output an enable signal EN1B and an enable signal EN1 with polarities different from each other, respectively. The enable signal EN1B is a signal obtained by inverting the enable signal EN once. The enable signal EN1 is a signal obtained by inverting the enable signal EN twice. Therefore, the enable signal EN1B is a signal obtained by inverting the enable signal EN1.

When the level of the enable signal EN1 is high, the NOR circuit 111 and the NAND circuit 112 operate. When the level of the enable signal EN1 is low, the NOR circuit 111 and the NAND circuit 112 stop operating. Thus, if the level of the enable signal EN is low, the comparator element 31 stops operating.

Figure 4:
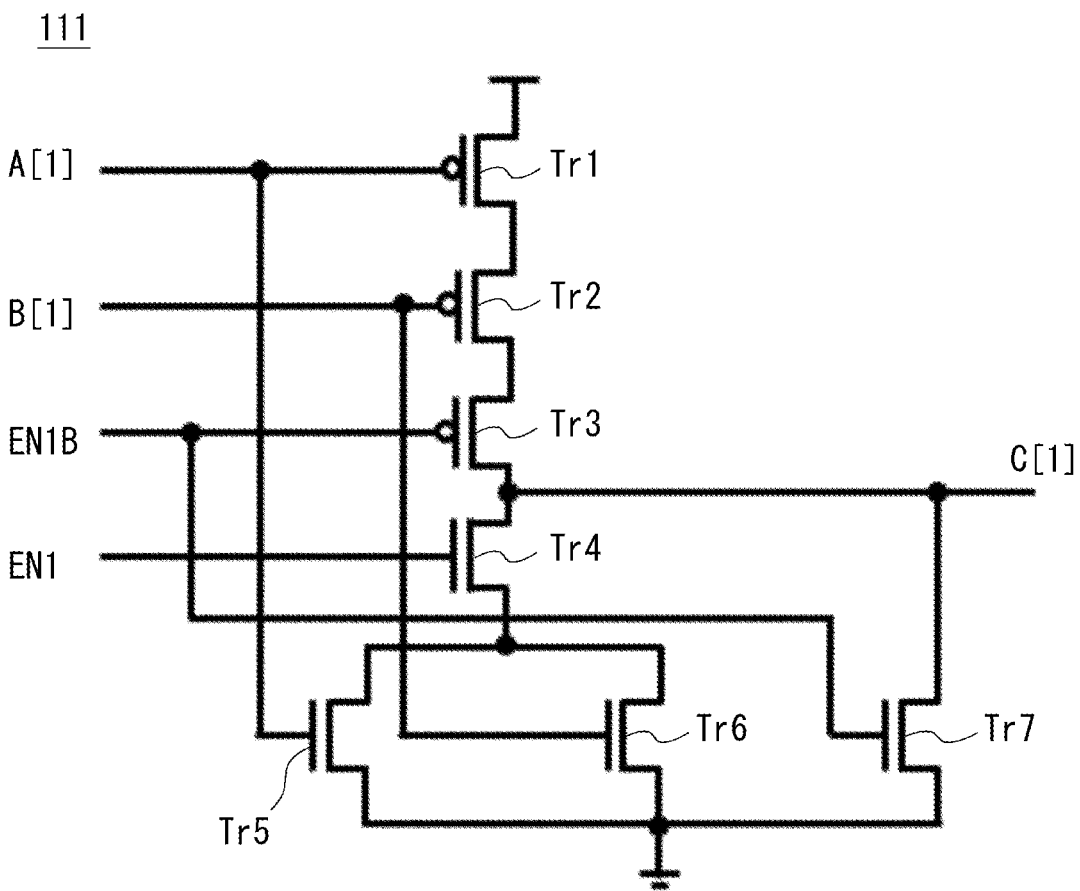
FIG. 4 is a circuit diagram of the NOR circuit 111.

FIG. 4 shows the circuit configuration of the NOR circuit 111. NOR circuit 111 is a CMOS (complementary metal-oxide-semiconductor) circuit and includes 7 transistors Tr1 to Tr7. The transistors Tr1 to Tr3 are p-type MOS transistors. The transistors Tr4 to Tr7 are n-type MOS transistors.

The transistors Tr1 to Tr4 are connected in series. Specifically, the transistors Tr1, Tr2, Tr3 and Tr4 are arranged from the power supply potential side to the ground side. The transistors Tr5 and Tr6 are connected in parallel between transistor Tr4 and the ground. An output signal C [1] is output from an output node between the transistors Tr3 and Tr4. In addition, the transistor Tr7 is arranged between the output node, which is located between the transistors Tr3 and Tr4, and the ground.

The latch output A [1] is input to the gate of the transistor Tr1 and the gate of the transistor Tr5. The counter output B [1] is input to the gate of the transistor Tr2 and the gate of the transistor Tr6. The enable signal EN1 is input to the gate of the transistor Tr3 and the gate of the transistor Tr7. The enable signal EN1B is input to the gate of the transistor Tr4.

Therefore, when the level of the enable signal EN1 is high, the NOR circuit 111 operates normally. That is, the output signal C [1] is the negative logical sum of the latch output A [1] and the counter output B [1]. The output signal C [1] is input to the inverter 113 in FIG. 2.

When the level of the enable signal EN1 is low, the transistor Tr3 and the transistor Tr4 are turned off and the transistor Tr7 is turned on. The NOR circuit 111 does not function and the level of the output signal C [1] becomes low. The NOR circuit 111 prevents an unnecessary switching operation. Therefore, the current flowing from the power supply potential to the ground can be reduced.

Figure 5:
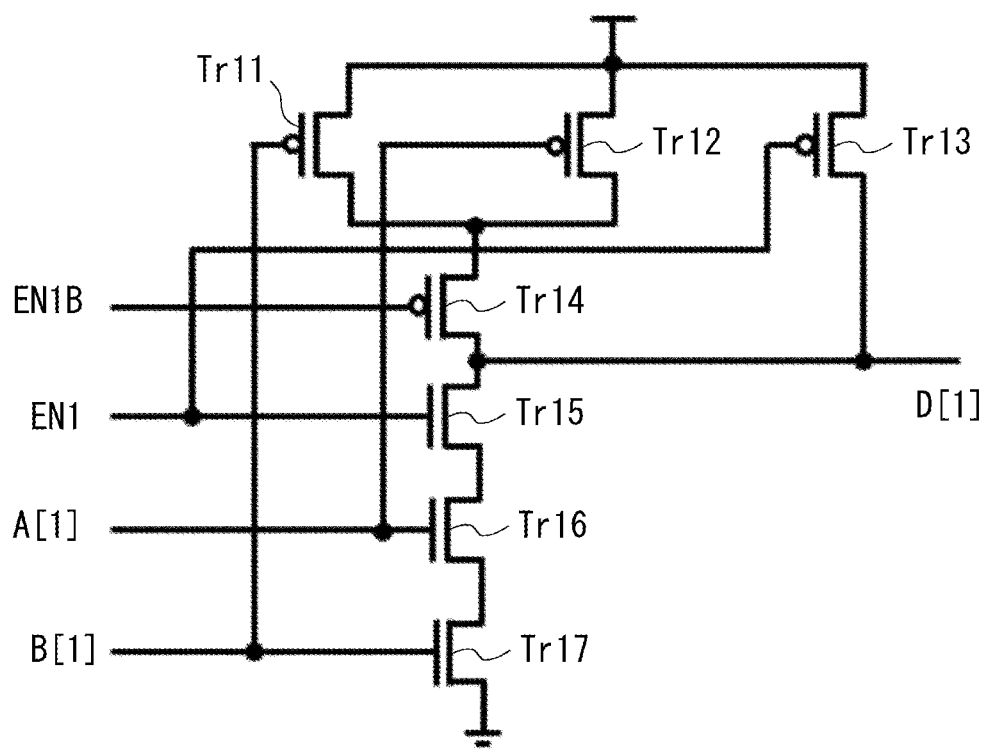
FIG. 5 is a circuit diagram of the NAND circuit 112.

FIG. 5 shows the circuit configuration of the NAND circuit 112. The NAND circuit 112 is a CMOS circuit and has 7 transistors Tr 11 to Tr 17. The transistors Tr 11 to Tr 14 are p-type MOS transistors. The transistors Tr 15 to Tr 17 are n-type MOS transistors.

The transistors Tr 14 to Tr 17 are connected in series. Specifically, the transistors Tr 17, Tr 16, Tr 15, and Tr 14 are arranged from the ground to the power supply potential. The transistors Tr 11 and Tr 12 are connected in parallel between the transistor Tr 14 and the power supply potential. An output signal D [1] is output from an output node between the transistor Tr 14 and the transistor Tr 15. In addition, the transistor Tr 13 is arranged between the output node, which is located between the transistors Tr 14 and Tr 15, and the power supply potential.

The latch output A is input to the gate of the transistor Tr 12 and the gate of the transistor Tr 16. The counter output B is input to the gate of the transistor Tr 11 and the gate of the transistor Tr 17. The enable signal EN1 is input to the gate of the transistor Tr 13 and the gate of the transistor Tr 15. The enable signal EN1B is input to the gate of the transistor Tr 14.

Therefore, when the level of the enable signal EN1 is high, the NAND circuit 112 operates normally. The output signal D [1] becomes the negative logical sum of the latch output A [1] and the counter output B [1]. The output signal D [1] is input to the NAND circuit 114 in FIG. 2.

When the level of the enable signal EN1 is low, the transistor Tr 14 and transistor Tr 15 are turned off and the transistor Tr 13 is turned on. Therefore, the NAND circuit 112 does not function, and the level of the output signal D [1] becomes high. The transistor Tr 14 and transistor Tr 15 are turned off. The NAND circuit 112 prevent an unnecessary switching operation. Therefore, the current flowing from the power supply potential to the ground can be reduced.

Thus, the operation of the one bit comparator 110 is stopped by the enable signals EN1 and EN1B. When the level of the enable signal EN1 is low, the value of the output signal C [1] becomes "0" and the value of the output signal D [1] becomes "1". That is, the output of the NOR circuit 111 and the output of the NAND circuit 112 are constant regardless of the values of the latch output A [1] and the counter output B [1].

When the level of the enable signal EN1 is low, the value of the output signal OUT [1] of the NAND circuit 114 shown in FIG. 2 becomes "0". Each of the 10 one bit comparators 110 includes the NOR circuit 111 shown in FIG. 4 and the NAND circuit 112 shown in FIG. 5. When the level of the enable signal EN1 is low, the level of the matching signal Z output from the comparator circuit 30 becomes low. Therefore, the matching signal Z becomes a positive pulse signal the level of which becomes high when the latch output A matches the counter output B.

As described above, the output signal OUT from FF circuit 33 becomes the enable signal EN that stops the operation of comparator element 31. The comparator circuit 30 has a self-gating function that stops the switching operation by the enable signal EN generated by the FF circuit 33. The comparator circuit 30 can stop the comparator element 31 at an appropriate time. After the comparator element 31 outputs the positive pulse, it stops operating. Thus, the power consumption can be reduced.

Furthermore, the switching operation in the comparator element 31 can be prevented. Therefore, the noise caused by the switching operation can be suppressed, thereby improving reliability.

Figure 6:
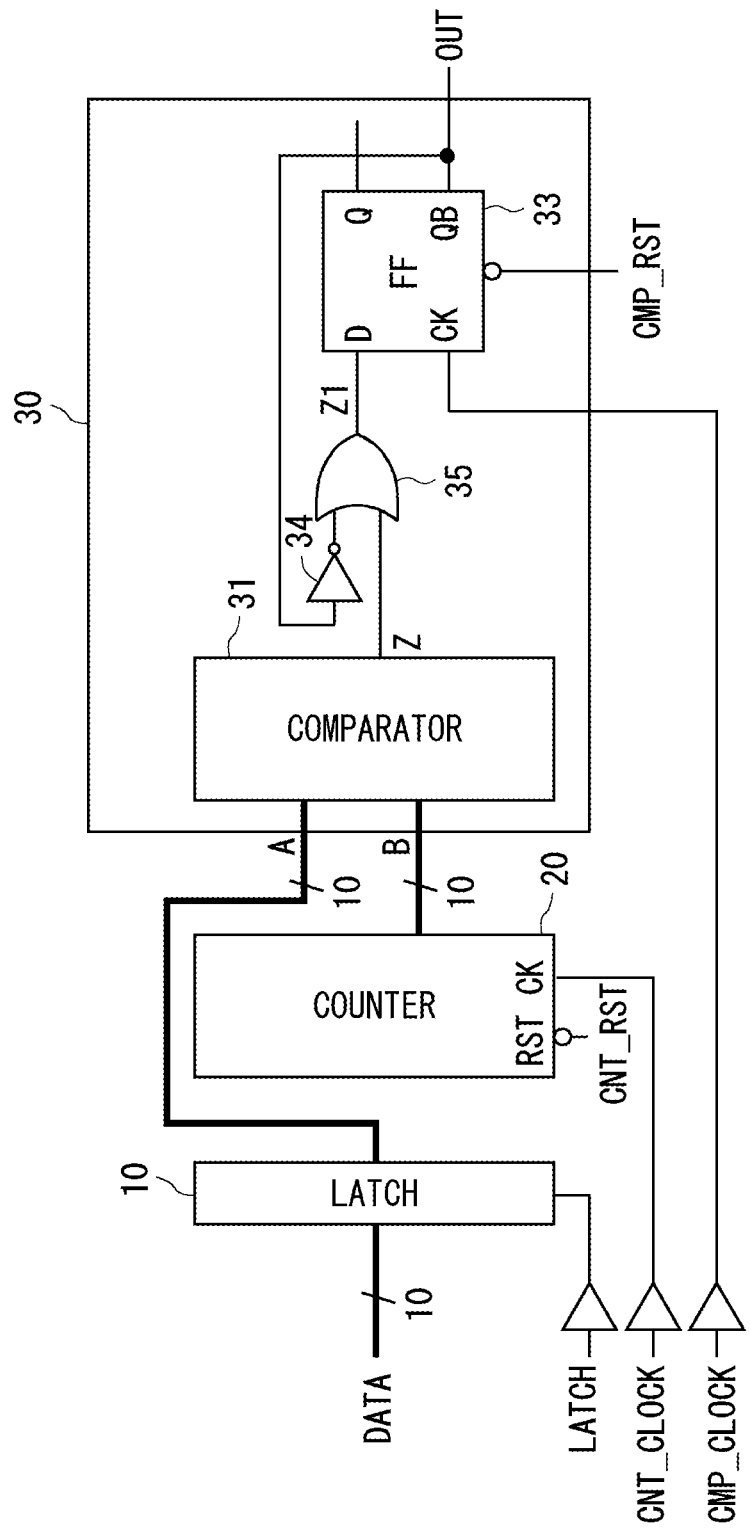
FIG. 6 is a circuit diagram showing the configuration of the comparator circuit in a comparative example.

FIG. 6 shows the driver including the comparator circuit 30 of the comparative example. Note that the basic operation of the latch circuit 10, the counter 20, and the comparator element 31 is similar to that described with reference to FIG. 1, so a detailed explanation is omitted. For example, comparator element 31 outputs the matching signal Z indicating that the latch output A matches the counter output B. The matching signal Z is a positive pulse.

In the comparator circuit 30 shown in FIG. 6, the output signal from FF circuit 33 is not used as the enable signal. Therefore, even after the latch output A matches the counter output B, the comparator element 31 performs the comparison operation. Thus, the comparator element 31 shown in FIG. 6 consumes more power than that of the comparator shown in FIG. 1.

On the other hand, in the comparator circuit 30 shown in FIG. 1, the comparator element 31 stops operating in response to the enable signal EN from the comparator circuit 30. Therefore, the power consumption in the comparator circuit 30 shown in FIG. 1 can be reduced as compared to that of the comparator 30 shown in FIG. 6.

The comparator circuit 30 and the driver 100 according to this embodiment can reduce the power consumption of a liquid crystal display device. When the driver 100 is applied to a WUXGA Liquid Crystal On-Silicon (LCOS) device with a frame rate of 120 Hz, the power consumption of the device can be reduced from 1188 mW to 1126 mW. That means an 5.3% (=62 mW) reduction in power consumption.

Figure 7:
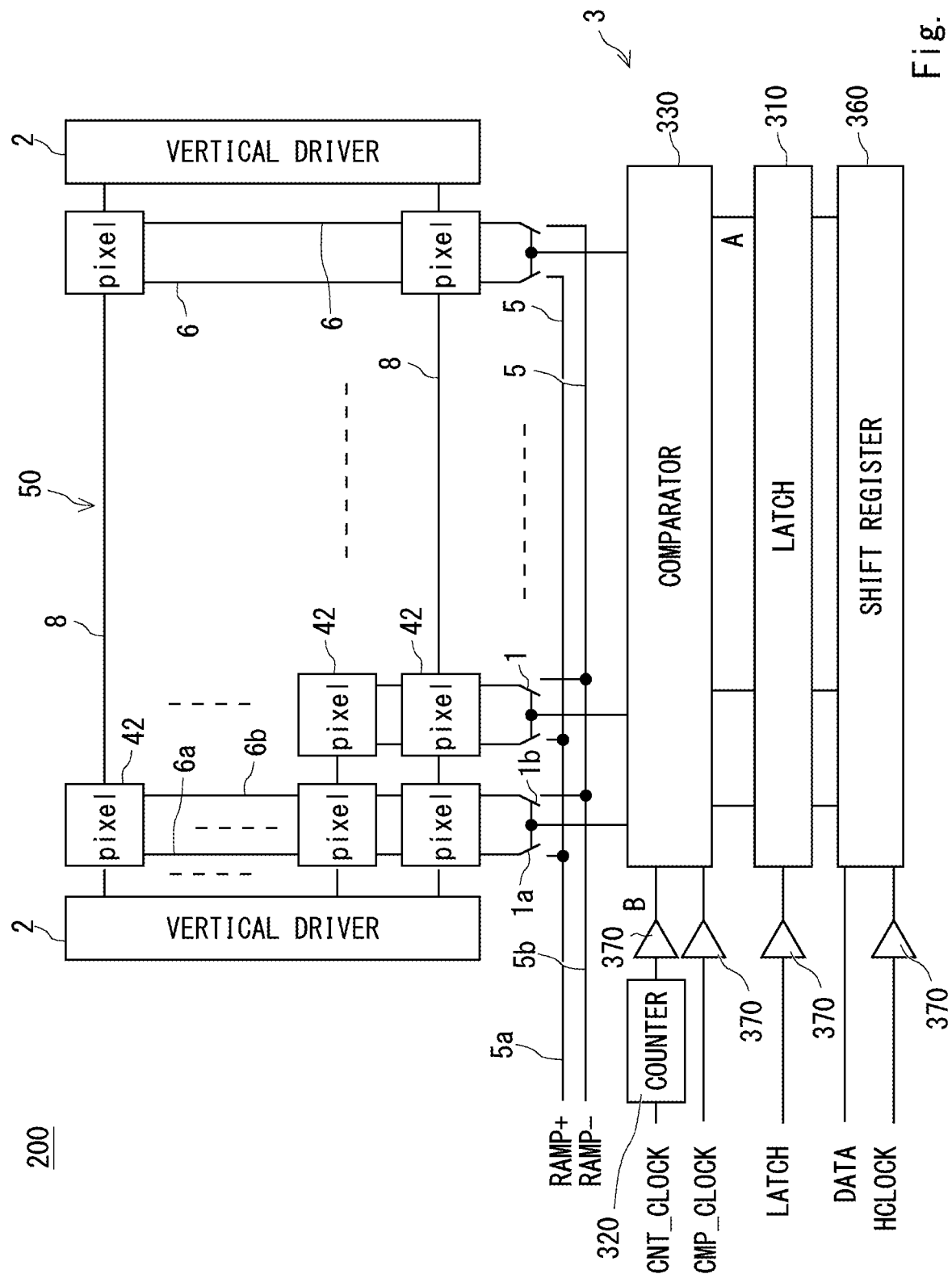
FIG. 7 shows a configuration of a liquid crystal display device using a driver.

The configuration of a liquid crystal display device 200 in which the comparator circuit 30 is applied to the driver will be described with reference to FIG. 7. The liquid crystal display device 200 is an LCOS display. FIG. 7 is a block diagram showing the backplane of the LCOS display.

The liquid crystal display device 200 includes a pixel display part 50, a vertical driver 2, and a horizontal driver 3. The horizontal driver 3 has the driver 100 shown in FIG. 1. Specifically, the horizontal driver 3 has m (m is an integer equal to or greater than 2) drivers 100, corresponding to the number of pixels for one line.

The pixel display part 50 has a plurality of data lines 6, a plurality of gate lines 8 and a plurality of pixels 42. The plurality of the data lines 6 are arranged parallel to each other. The plurality of the gate lines 8 are arranged parallel to each other. The plurality of the data lines 6 are arranged to intersect with the plurality of the gate lines 8. The gate lines 8 are row scan lines.

The liquid crystal display device 200 is includes two or more sets of the data lines 6 in a set of two data lines. The liquid crystal display device 200 inverts and drives the pixels 42 using one of the sets of the data lines 6. Hereafter, regarding the sets of the data lines 6, the data line 6 on the positive side is defined as a data line 6a, and the data line 6 on the negative side is defined as a data line 6b. For switches 1 and video signal lines 5, the polarity is similarly respectively identified by defining a switch 1a, a switch 1b, a video signal line 5a and a video signal line 5b. To reverse the polarity, two systems including the data lines 6, the switches 1 and the video signal lines 5 are provided.

The pixels 42 are located at the intersections of the data lines 6 and the gate lines 8. The pixels 42 are arranged in a matrix. Each pixel 42 is driven by one set of the two data lines 6 and one of the gate line 8. For example, when there are n gate lines 8 and 2m data lines, the pixels 42 are arranged in a matrix of n rows by m columns. Each of m and n is an integer equal to or greater than 2. Each of the pixels 42 includes a pixel driver and a pixel electrode to drive liquid crystals.

The vertical driver 2 performs vertical drive to select the gate lines 8 for each horizontal scanning period. The vertical driver 2 supplies scanning signals to the gate lines 8. That is, the vertical driver 2 supplies the scanning signals so that the first row to n-th row of gate lines 8 are sequentially selected. This sequentially selects the pixels 42 for each row. All gate lines 8 are selected within one vertical scanning period. The pixels 42 in a selected row can be written by the video signal.

The horizontal driver 3 performs horizontal driving to drive the switches 1 within a horizontal scanning period. In this way, the video signals are supplied to the plurality of the data lines 6. As described above, each set of the two data lines 6a and 6b is connected to the pixels 42 as a pair. Thus, the two data lines 6a and 6b are commonly connected to each of the pixels 42 in a row.

The data line 6a is connected to the video signal line 5a via the switch 1a. The data line 6b is connected to the video signal line 5b via the switch 1b. A video signal RAMP+ on the positive side is supplied to the video signal line 5a. A video signal RAMP− on the negative side is supplied to the video signal line 5b. The horizontal driver 3 controls the switches 1a and 1b.

Thus, one data line 6a of the set of the data line 6a and 6b is supplied with the video signal RAMP+ on the positive polarity, and the other data line 6b is supplied with the video signal RAMP− on the negative polarity. The video signal RAMP+ on the positive polarity becomes a positive voltage with respect to the common potential of the common electrode line, and the video signal RAMP− on the negative polarity becomes a negative voltage with respect to the common potential of the common electrode line. The horizontal driver 3 can supply the video signal RAMP+ on the positive polarity and the video signal RAMP− on the negative polarity to the pixels 42 in the selected row. The horizontal driver 3 turns each switch 1 on and off multiple times within the horizontal scanning period. Thus, the video signal RAMP+ on the positive polarity and the video signal RAMP− on the negative polarity are alternately supplied to the pixels 42.

Specifically, the horizontal driver 3 includes a latch circuit 310, a counter 320, a comparator circuit 330, a shift register 360 and buffers 370. The latch circuit 310 corresponds to the latch circuit 10 in FIG. 1. That is, the latch circuit 310 has m columns of the latch circuits 10. The latch circuit 310 holds image data DATA of the pixels 42 in columns 1 to m.

The comparator circuit 330 corresponds to the comparator circuit 30 in FIG. 1. That is, the comparator circuit 330 has m columns of the comparator circuit 30. The output signal OUT from the comparator circuit 30 shown in FIG. 1 controls switch 1. The counter 320 corresponds to the counter 20 in FIG. 1. Therefore, the counter 320 performs a counting operation according to the counter clock signal CNT_CLOCK.

The shift register 360 sequentially transmits m columns of image data DATA according to the horizontal clock HCLOCK. When the shift register 360 holds m columns of the image data DATA, the shift register 360 outputs the image data DATA to the latch circuit 310. The latch circuit 310 stores the image data DATA of each column in response to the latch signal LATCH.

The comparator circuit 330 compares the latch output A with the counter output B, as shown in FIG. 1. The comparator circuit 330 controls a pair of switches 1a and 1b. The pair of switches 1a and 1b opens and closes in response to the output signal of the comparator circuit 330. Initially, the video signal is not supplied to the pixels 42 because all the pairs of the switches 1 are closed. When the output signal of the comparator circuit 330 is asserted, the switch 1 which corresponds to video signal is opened. Thus, the video signal RAMP+ on the positive polarity and a video signal RAMP− on the negative polarity are alternately applied to the pixels 42. The liquid crystal display device 200 can perform gradation display according to the image data DATA.

The buffers 370 buffer various signals output from an external controller. The buffers 370 are used to drive loads that are heavy due to the large number of rows in the pixel display part 50. For example, a horizontal clock signal HCLOCK is input to the shift register 360 via the buffer 370. Similarly, the latch signal LATCH is input to the latch circuit 310 via the buffer 370. The counter output from the counter 320 is input to the comparator circuit 330 via the buffer 370.

In this embodiment, the comparator circuit 330 includes the comparator circuit 30 shown in FIG. 1. Thus, a buffer for the comparator clock signal input into the comparator circuit 330 can be omitted. In other words, the number of buffers can be reduced in accordance with the number of columns, and thus it is possible to reduce power consumption. Furthermore, since timing errors can be suppressed, reliability can be improved.

As described above, the invention made by the inventor has been specifically explained based on the embodiment, but the invention is not limited to the above embodiment, and it goes without saying that various modifications can be made without departing from the gist of the invention.

What is claimed is:

1. A comparator circuit: comprising:
   a comparator element configured to output a matching signal indicating whether or not a value of a first input signal matches a value of a second input signal;
   a flip-flop circuit configured to hold a data of a data input terminal based on a comparator clock signal and configured to output an enable signal for stopping an operation of the comparator element; and
   an internal signal generation circuit configured to output an internal signal to the data input terminal based on the matching signal and an output signal output from the flip-flop circuit.

2. The comparator circuit according to claim 1, wherein an inverted output signal output from an inverted output terminal of the flip-flop circuit is the enable signal.

3. The comparator circuit according to claim 2, wherein the internal signal generation circuit comprises:
   an inverter to which the inverted output signal is input; and
   an OR circuit configured to output a logical sum of a signal output from the inverter and the matching signal.

4. The comparator circuit according to claim 1, wherein the comparator element comprises a PMOS Transistor and a NMOS transistor connected in series between a power supply potential and a ground potential, and
   wherein the PMOS transistor and the NMOS transistor operate in accordance with the enable signal.

5. A driver of a liquid crystal display device comprising:
   a comparator circuit according to claim 1;
   a latch circuit configured to hold pixel data and output the pixel data to the comparator circuit as the first input signal; and
   a counter configured to perform a count operation in accordance with a counter clock signal and output a count value as the second input signal.

* * * * *